(12) United States Patent
Matsumoto et al.

(10) Patent No.: US 11,227,813 B2
(45) Date of Patent: Jan. 18, 2022

(54) ELECTRONIC APPARATUS

(71) Applicant: SHINKO ELECTRIC INDUSTRIES CO., LTD., Nagano (JP)

(72) Inventors: Takayuki Matsumoto, Nagano (JP); Tsukasa Nakanishi, Nagano (JP); Tadaaki Katsuyama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/922,614

(22) Filed: Jul. 7, 2020

(65) Prior Publication Data

US 2021/0013129 A1 Jan. 14, 2021

(30) Foreign Application Priority Data

Jul. 10, 2019 (JP) .............................. JP2019-128795

(51) Int. Cl.
*H01L 23/492* (2006.01)
*H01L 23/16* (2006.01)
*H01L 23/498* (2006.01)

(52) U.S. Cl.
CPC ............ *H01L 23/492* (2013.01); *H01L 23/16* (2013.01); *H01L 23/49838* (2013.01)

(58) Field of Classification Search
CPC .. H01L 23/492; H01L 23/16; H01L 23/49838
See application file for complete search history.

(56) References Cited

U.S. PATENT DOCUMENTS

| 2008/0054438 | A1* | 3/2008 | Germain | ............. | H01L 23/4334 |
| | | | | | 257/690 |
| 2009/0121330 | A1* | 5/2009 | Cruz | ................. | H01L 23/49503 |
| | | | | | 257/676 |
| 2011/0285009 | A1 | 11/2011 | Chi et al. | | |
| 2013/0256852 | A1* | 10/2013 | Wyant | ..................... | H01L 24/84 |
| | | | | | 257/670 |

FOREIGN PATENT DOCUMENTS

WO 2016-076162 5/2016

* cited by examiner

*Primary Examiner* — Peniel M Gumedzoe
(74) *Attorney, Agent, or Firm* — Rankin, Hill & Clark LLP

(57) ABSTRACT

An electronic apparatus includes: a first metal layer; an electronic component that is provided on the first metal layer; a second metal layer that is provided on the first metal layer and on the electronic component; and an insulating resin that fills a space between the first metal layer and the second metal layer so as to cover the electronic component. The second metal layer includes: a sheet-like electrode pad portion; and a connection portion that is disposed along a peripheral edge of the electrode pad portion, and that protrudes from the electrode pad portion toward the first metal layer so as to electrically connect the second metal layer to the first metal layer.

10 Claims, 16 Drawing Sheets

ELECTRONIC APPARATUS

This application claims priority from Japanese Patent Application No. 2019-128795 filed on Jul. 10, 2019, the entire contents of which are herein incorporated by reference.

BACKGROUND

1. Technical Field

The present disclosure relates to an electronic apparatus.

2. Background Art

There have been recently known electronic apparatuses in each of which, for example, a plurality of electronic components such as an IC (Integrated Circuit) chip and an inductor are mounted on a board. As such an electronic apparatus, for example, a plurality of electronic components may be mounted on a lead frame made of metal (see e.g., WO 2016/076162 and US2011/0285009A1).

However, it is difficult to reduce the size of the electronic apparatus provided with the plurality of electronic components. Specifically, assume that, for example, the electronic components are disposed and arranged side by side on the lead frame. In this case, as the number of the electronic components increases, an area occupied by the electronic components increases so that an area of the lead frame also increases. As a result, the size of the electronic apparatus in which the plurality of electronic components are mounted on the lead frame is increased.

SUMMARY

According to one aspect of the present disclosure, an electronic apparatus is provided.

The electronic apparatus comprises:
a first metal layer;
an electronic component that is provided on the first metal layer;
a second metal layer that is provided on the first metal layer and on the electronic component; and
an insulating resin that fills a space between the first metal layer and the second metal layer so as to cover the electronic component, The second metal layer comprises:
a sheet-like electrode pad portion; and
a connection portion that is disposed along a peripheral edge of the electrode pad portion, and that protrudes from the electrode pad portion toward the first metal layer so as to electrically connect the second metal layer to the first metal layer.

DETAILED DESCRIPTION

An embodiment of an electronic apparatus and an electronic apparatus manufacturing method disclosed by the present application will be described below in detail with reference to the drawings. Incidentally, the present invention should not be limited by the embodiment.

Figure 1:
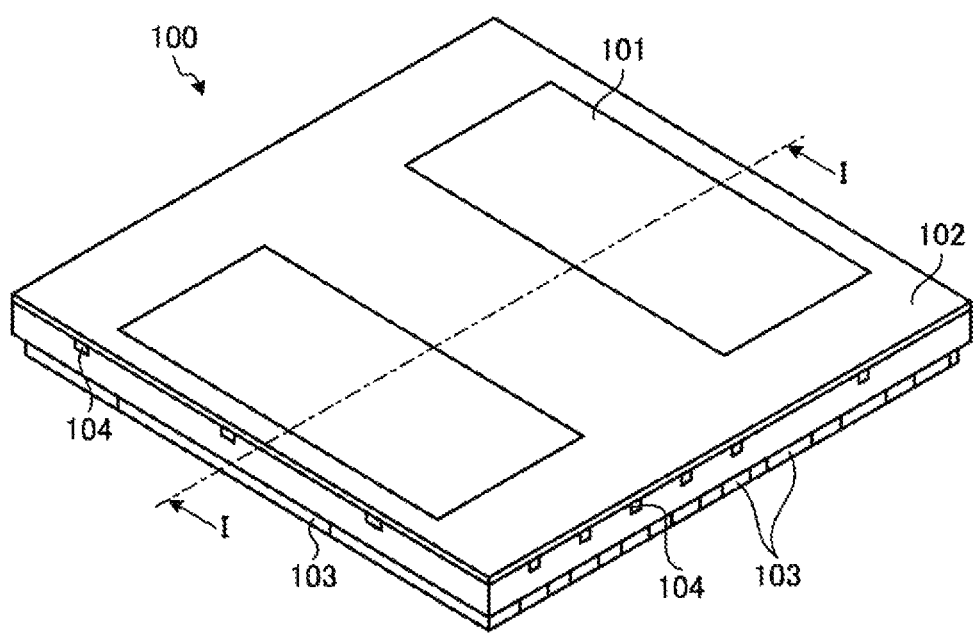
FIG. 1 is a perspective view showing the configuration of an electronic apparatus according to an embodiment.

FIG. 1 is a perspective view showing the configuration of an electronic apparatus 100 according to an embodiment. As shown in FIG. 1, the electronic apparatus 100 substantially has a rectangular parallelepiped shape, and, for example, an electronic component such as an IC chip is internally embedded in the electronic apparatus 100. That is, the electronic apparatus 100 is formed in such a manner that the electronic component interposed and mounted between two metal layers is entirely resin-encapsulated. The electronic apparatus 100 is provided with electrode pads 101 in its upper face. The electrode pads 101 serve, for example, for mounting a passive component such as an inductor thereon. The circumferences of the electrode pads 101 are covered with a solder resist layer 102. Further, a plurality of external terminals 103 which are connected to the internal IC chip, and end faces of coupling portions 104 which couple metal layers forming the electrode pads 101 to a frame during manufacturing are exposed in side faces of the electronic apparatus 100.

Incidentally, the face of the electronic apparatus 100 on which the passive component can be mounted will be hereinafter described as upper side face (upper face). However, the electronic apparatus 100 may be, for example, manufactured and used in a vertically inverted state or may be manufactured and used at any posture.

Figure 2:
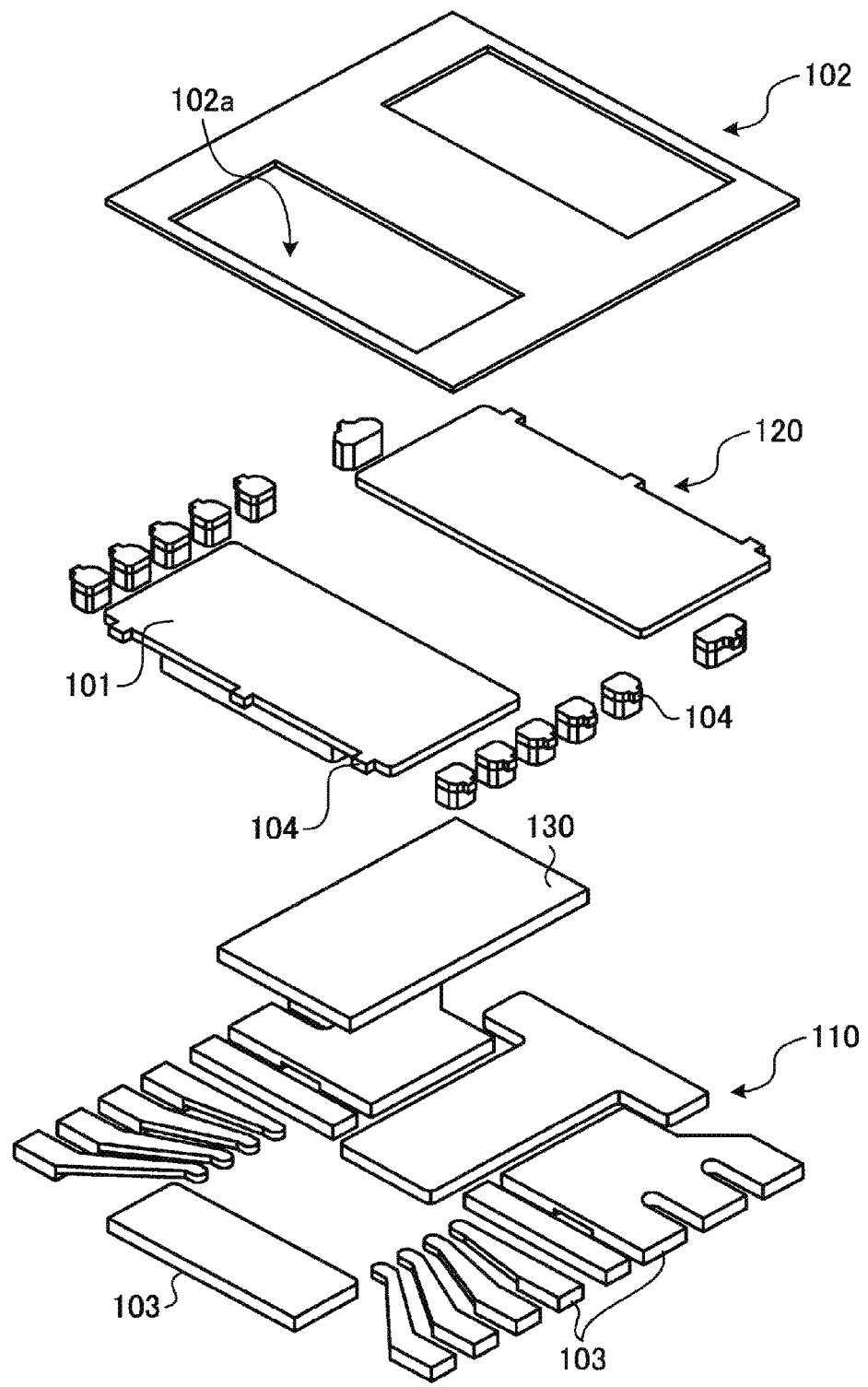
FIG. 2 is an assembly diagram showing the configuration of the electronic apparatus according to the embodiment.

FIG. 2 is an assembly diagram showing the configuration of the electronic apparatus 100 according to the embodiment. As shown in FIG. 2, the electronic apparatus 100 has an IC chip 130 interposed between a first metal layer 110 and a second metal layer 120, and has a solder resist layer 102 provided on an upper face of the second metal layer 120.

The first metal layer 110 is a layer on which the IC chip 130 is flip-chip mounted, and in which the external terminals 103 connecting the IC chip 130 to the outside of the electronic apparatus 100 are formed. For example, copper or a copper alloy, an iron-nickel (Fe—Ni) alloy such as 42Alloy, or the like, can be used as the material of the first metal layer 110. In addition, the first metal layer 110 can be, for example, set to be about 0.1 to 0.3 mm thick. The first metal layer 110 may be referred to as lead frame.

The second metal layer 120 is a layer between which and the first metal layer 110 the IC chip 130 is interposed and in which the electrode pads 101 connected to a passive component mounted on the upper face of the electronic component 100 are formed. During manufacturing of the second metal layer 120, the second metal layer 120 is coupled to the ambient frame by the coupling portions 104. The second metal layer 120 absorbs heat generated from the passive component mounted on the electrode pads 101, and radiates the heat through the first metal layer 110. For example, copper or a copper alloy, an iron-nickel (Fe—Ni) alloy such as 42Alloy, or the like, can be used as the material of the second metal layer 120 in a manner similar to or the same as the first metal layer 110. In addition, the second metal layer 120 can be, for example, set to be about 0.1 to 0.8 mm thick. The second metal layer 120 may be referred to as lead frame.

The IC chip 130 is an electronic component in which an electronic circuit having various functions is integrated on a semiconductor. A plurality of terminals are provided in a face of the IC chip 130 opposed to the first metal layer 110, and these terminals are connected to the first metal layer 110.

The first metal layer 110, the second metal layer 120 and the IC chip 130 are encapsulated with an insulating resin. The upper face of the electronic apparatus 100 formed by the second metal layer 120 and the insulating resin is covered with the solder resist layer 102. The solder resist layer 102 is an insulating layer in which opening portions 102a are formed at the positions of the electrode pads 101. That is, the solder resist layer 102 covers the upper face of the electronic apparatus 100 and exposes the electrode pads 101 from the opening portions 102a.

Figure 3:
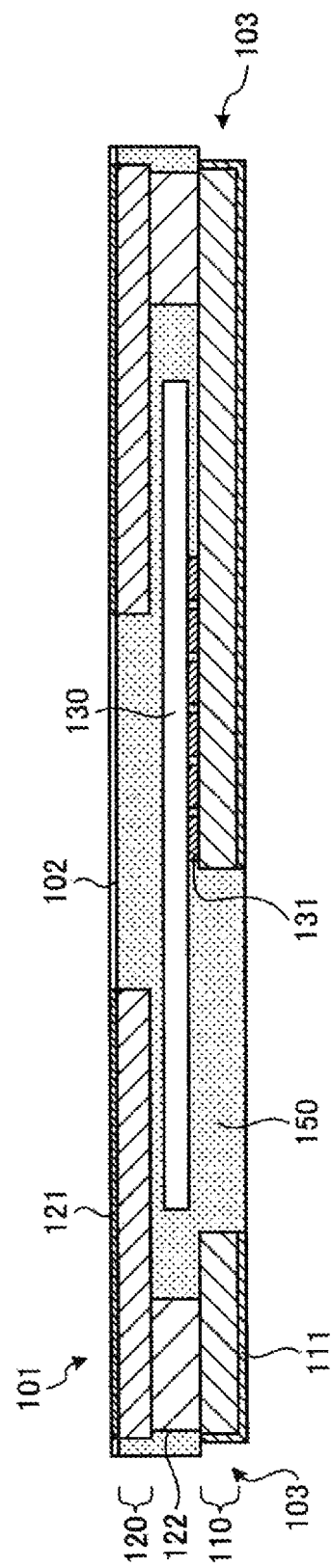
FIG. 3 is a schematic view showing a section taken along a line I-I shown in FIG. 1.

FIG. 3 is a schematic view showing a section taken along a line I-I shown in FIG. 1. As shown in FIG. 3, the IC chip 130 is mounted on an upper face of the first metal layer 110 such that the plurality of terminals 131 of the IC chip 130 are connected to the first metal layer 110. For example, each of the terminals 131 may be a solder bump. In addition, connection portions 122 protruding from a lower face of the second metal layer 120 contact the upper face of the first metal layer 110 to support the second metal layer 120.

The first metal layer 110, the second metal layer 120 and the IC chip 130 are encapsulated with the insulating resin 150. That is, a space surrounding the first metal layer 110, the second metal layer 120 and the IC chip 130 is filled with the insulating resin 150. For example, an insulating resin such as a polyimide-based resin or an epoxy-based resin or a resin material in which a filler of silica, alumina, or the like, is mixed with these resins can be used as the material of the insulating resin 150.

An electroplating layer 111 is formed on an exposed face of the first metal layer 110 which is not covered with the insulating resin 150. Faces of the electrically plating layer 111 exposed in the side faces and a lower face of the electronic apparatus 100 form the external terminals 103. Side faces of the external terminals 103 are positioned to be set back inward of the electronic apparatus 100 from the insulating resin 150 surrounding the second metal layer 120. That is, the side faces of the external terminals 103 are exposed at the positions set back inward from an outer periphery of the electronic apparatus 100. Side faces of the insulating resin 150 surrounding the first metal layer 110 are also set back inward from the outer periphery of the electronic apparatus 100 in accordance with the positions of the side faces of the external terminals 103. Accordingly, portions of the first metal layer 110 are set back inward from portions of the second metal layer 120 in the side faces of the electronic apparatus 100. In addition, an electroplating layer 121 is formed on the exposed face of the second metal layer 120 which is not covered with the insulating resin 150 and the solder resist layer 102. The second metal layer 120 and the electroplating layer 121 form the electrode pads 101 on which the passive component is mounted.

Thus, the IC chip 130 is mounted inside the electronic apparatus 100, and the electrode pads 101 on which the passive component is mounted are formed in the upper face of the electronic apparatus 100. Thus, the IC chip 130 and the passive component can be superimposed and disposed on each other three-dimensionally. Accordingly, the IC chip 130 and the passive component do not have to be arranged side by side and disposed planarly on one and the same substrate so that an area occupied by the IC chip 130 and the passive component can be reduced. Consequently, the size of the electronic apparatus 100 can be reduced. In addition, since the connection portions 122 connect the first metal layer 110 and the second metal layer 120 to each other, a plurality of columnar connection portions connecting two metal layers to each other is not necessary. Accordingly, the size of the electronic apparatus 100 can be reduced in comparison with that in a case where a plurality of connection portions disposed at intervals from one another are provided.

Figure 4:
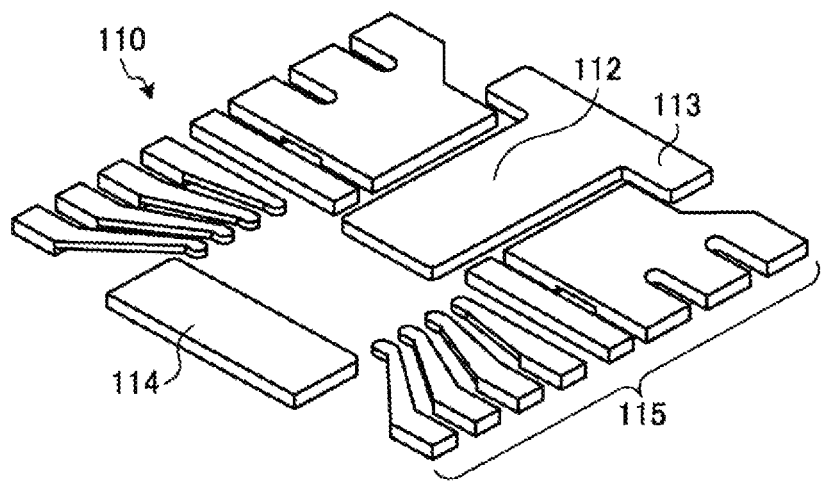
FIG. 4 is a perspective view showing the configuration of a first metal layer.

FIG. 4 is a perspective view showing the configuration of the first metal layer 110. The first metal layer 110 shown in FIG. 4 has a component placement portion 112, other-layer support portions 113 and 114, and terminal portions 115.

The component placement portion 112 is a sheet-like portion positioned substantially at the center of the first metal layer 110. The IC chip 130 is placed on an upper face of the component placement portion 112.

The other-layer support portion 113 is a sheet-like portion which is continuous from the component placement portion 112 and provided along one of peripheral edges of the first metal layer 110. The other-layer support portion 113 contacts a corresponding one of the connection portions 122 protruding from the lower face of the second metal layer 120, so as to support the second metal layer 120. Of end faces of an outer periphery of the other-layer support portion 113, an end face positioned in the peripheral edge of the first metal layer 110, and a lower face of the other-layer support portion 113 are exposed from the corresponding side face and the lower face of the electronic apparatus 100 respectively so as to form external terminals 103.

The other-layer support portion 114 is a sheet-like portion which is provided along one of the peripheral edges of the first metal layer 110 at an opposite position to the other-layer support portion 113. The other-layer support portion 114 contacts a corresponding one of the connection portions 122 protruding from the lower face of the second metal layer 120, so as to support the second metal layer 120. Of end faces of an outer periphery of the other-layer support portion 114, an end face positioned in the peripheral edge of the first metal layer 110, and a lower face of the other-layer support portion 114 are exposed from the corresponding side face and the lower face of the electronic apparatus 100 respectively so as to form external terminals 103.

Each of the terminal portions 115 is a portion which is made of a plurality of separated metal plates and which has one end substantially positioned at the center of the first metal layer 110 and the other end positioned at one of the peripheral edges of the first metal layer 110. The one end of the terminal portion 115 positioned at the center of the first metal layer 110 is connected to terminals of the IC chip 130. The other end of the terminal portion 115 positioned in the peripheral edge of the first metal layer 110 is exposed from a corresponding one of the side faces of the electronic apparatus 100 so as to form external terminals 103. In addition, the terminal portion 115 has a shape thicker on the other end side than on the one end side. That is, the terminal portion 115 is made thicker in the corresponding peripheral edge of the first metal layer 110, and a lower face of the terminal portion 115 which is made thicker on the other end side is exposed from the lower face of the electronic apparatus 100 so as to form the external portions 103. On the other hand, the lower face of the terminal portion 115 which is made thinner on the one end side is covered with the insulating resin 150. Thus, the terminal portion 115 whose thickness varies between the one end side and the other end side can be, for example, formed by half etching.

Figure 5A:
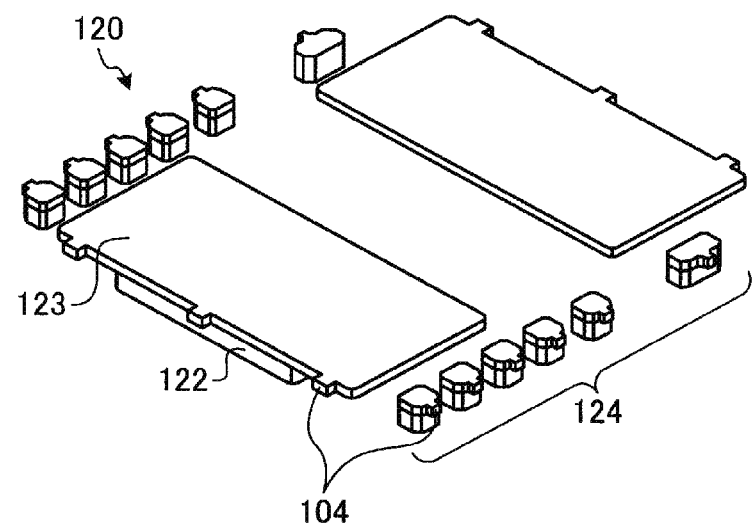
FIGS. 5A and 5B are perspective views showing the configuration of a second metal layer.
Figure 5B:
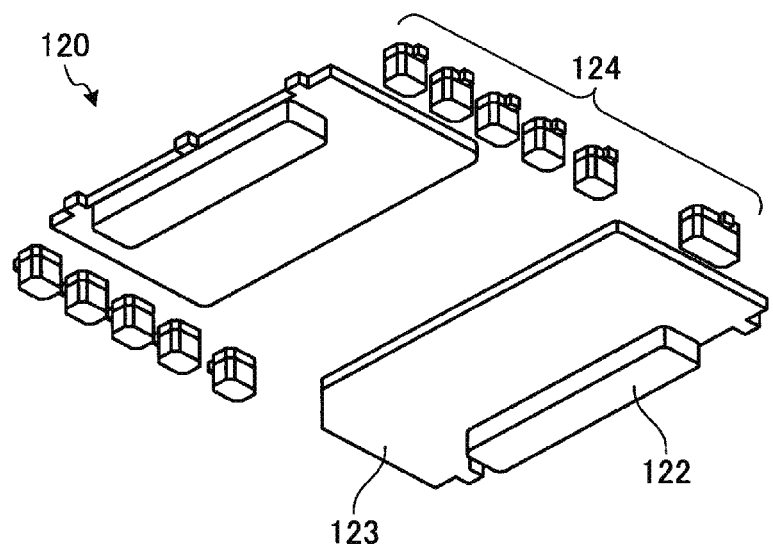

FIGS. 5A and 5B are perspective views showing the configuration of the second metal layer 120. That is, FIG. 5A is a perspective view showing the configuration of the upper face of the second metal layer 120. FIG. 5B is a perspective view showing the lower face of the second metal layer 120. The second metal layer 120 shown in FIGS. 5A and 5B has connection portions 122, electrode pad portions 123, and power feed portions 124.

Each of the connection portions 122 is a protrusion which connects the second metal layer 120 and the first metal layer 110 to each other. The connection portions 122 are supported by the other-layer support portions 113 and 114 of the first metal layer 110. The connection portions 122 are provided along two opposite sides of the peripheral edges of the second metal layer 120. In other words, the connection portions 122 protrude respectively from lower faces of the electrode pad portions 123 at positions extending along peripheral edges of the electrode pad portions 123. Lower ends of the connection portions 122 contact the other-layer support portions 113 and 114 of the first metal layer 110 to electrically connect the second metal layer 120 and the first metal layer 110 to each other. Since each of the connection portions 122 is a single protrusion extending along a corresponding one of the peripheral edges of the electrode pad portions 123, the second metal layer 120 and the first metal layer 110 can be connected to each other in a comparatively larger area than that in a case where, for example, columnar protrusions are provided. Therefore, electrical resistance between the second metal layer 120 and the first metal layer 110 can be reduced, and efficiency of heat conduction can be improved. In addition, in comparison with a case where the same connection area as each of the connection portions 122 is secured by a plurality of columnar protrusions, the plurality of protrusions disposed at intervals can be dispensed with so that the size of the electronic apparatus 100 can be reduced.

Each of the electrode pad portions 123 is a portion made of a pair of sheet-like metal plates occupying a relatively large portion of the second metal layer 120. Upper faces of the electrode pad portions 123 are exposed from the upper face of the electronic apparatus 100 so as to form the electrode pads 101. That is, for example, the passive component such as the inductor is placed on the upper faces of the electrode pad portions 123. The passive component may generate heat. The connection portions 122 protrude from the lower faces of the electrode pad portions 123 to extend along the peripheral edges of the electrode pad portions 123. Since each of the connection portions 122 is connected to the first metal layer 110 in a relatively large face, the heat can be radiated efficiently. As will be described later, the electrode pad portions 123 are coupled to the frame by the coupling portions 104 during manufacturing of the second metal layer 120. In addition, each of the electrode pad portions 123 is shaped like a rectangle by way of example.

The power feed portions 124 are provided at positions corresponding to the terminal portions 115 of the first metal layer 110 so as to respectively feed electric power to the terminal portions 115 of the first metal layer 110 during electroplating. That is, when the power feed portions 124 are connected to the terminal portions 115 of the first metal layer 110 respectively and electric power is passed through the second metal layer 120 during electroplating, the electric power is fed to the terminal portions 115 each of which is made of separated metal plates. As will be described later, the power feed portions 124 are coupled to the frame by the coupling portions 104 during the manufacturing of the second metal layer 120.

Figure 6:
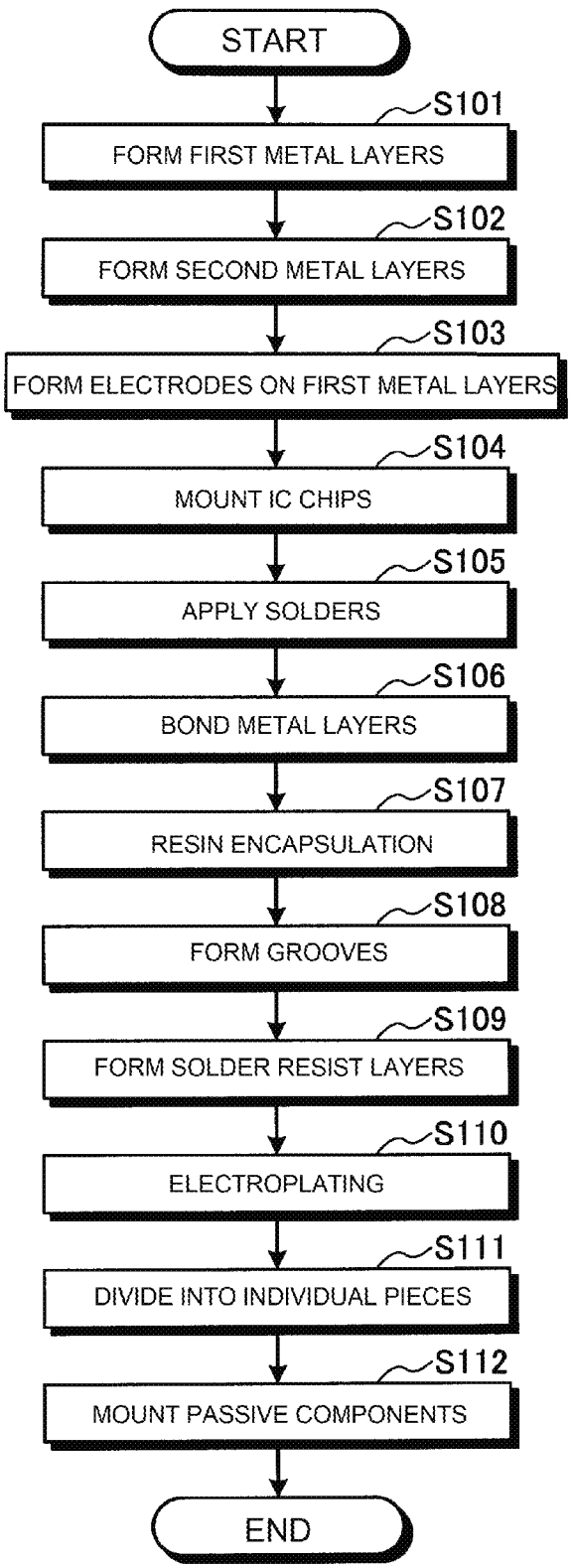
FIG. 6 is a flow chart showing an electronic apparatus manufacturing method according to the embodiment.

Next, a method for manufacturing such electronic apparatuses 100 each having the aforementioned configuration will be described with reference to a flow chart shown in FIG. 6.

First, first metal layers 110 and second metal layers 120 to be frameworks of the electronic apparatuses 100 are formed (steps S101 and S102). The first metal layers 110 and the second metal layers 120 are formed by etching metal plates respectively. On this occasion, the first metal layers 110 or the second metal layers 120 of the electronic apparatuses 100 are formed in one piece of metal plate.

Figure 7:
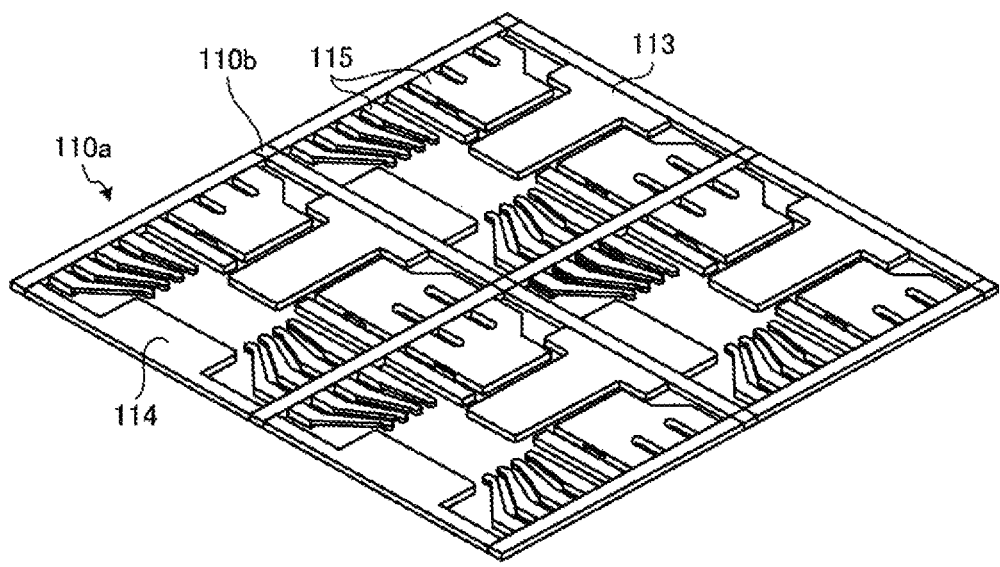
FIG. 7 is a view illustrating a first metal layer forming step.

Specifically, for example, as shown in FIG. 7, four first metal layers 110 of four electronic apparatuses 100 are formed in a first metal plate 110a to be arranged side by side into a latticed pattern and respectively in, for example, four regions surrounded by a frame 110b. That is, the four first metal layers 110 are defined by the frame 110b. The first metal plate 110a is dissolved by etching so as to make component placement portions 112, other-layer support portions 113 and 114, terminal portions 115, and the frame 110b stay behind. In addition, a portion thinner in thickness than its circumference may be formed by half etching to provide each of the first metal layers 110 with a step in thickness. Specifically, for example, in each of the terminal portions 115, one end at a center portion thereof is thinner than the other end at a peripheral edge portion thereof. The other end of the terminal portion 115 which is thicker is coupled to the frame 110b. In addition, end portions of outer peripheries of the other-layer support portions 113 and 114 are also coupled to the frame 110b.

Figure 8:
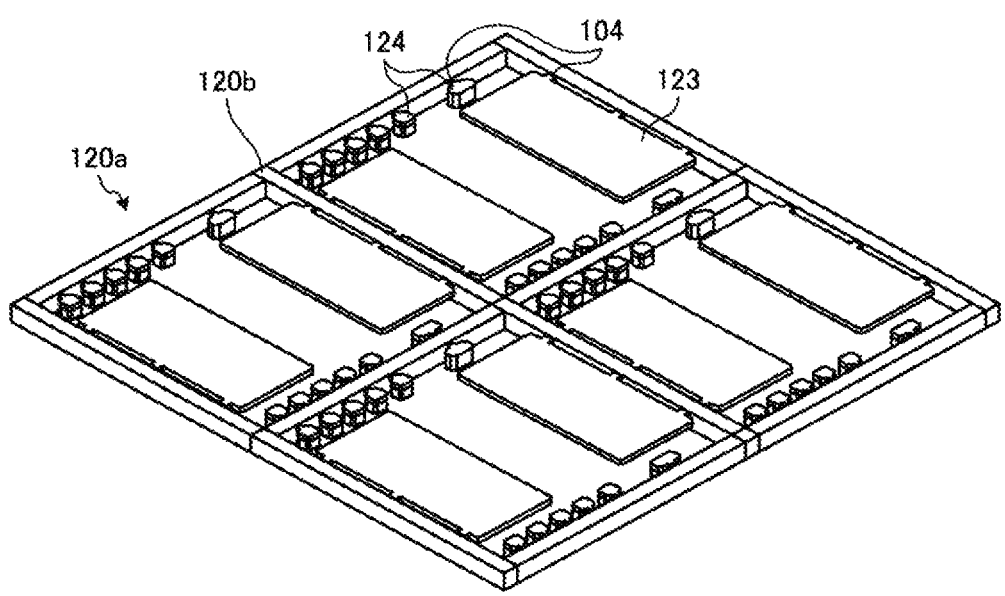
FIG. 8 is a view illustrating a second metal layer forming step.

For example, as shown in FIG. 8, four second metal layers 120 of the four electronic apparatuses 100 are formed in a second metal plate 120a so as to be arranged side by side into a latticed pattern and respectively in, for example, four regions surrounded by a frame 120b in a manner similar to or the same as the first metal layers 110. That is, the four second metal layers 120 are defined by the frame 120b. The second metal plate 120a is dissolved by etching so as to make connection portions 122, electrode pad portions 123, power feed portions 124, and the frame 120b stay behind. On this occasion, the circumferences of the connection portions 122 in lower faces of the electrode pad portions 123 are half-etched. Thus, the electrode pad portions 123 are thinned in the circumferences of the connection portions 122. As a result, the connection portions 122 protruding from the lower faces of the electrode pad portions 123 can be formed. The connection portions 122 and the power feed portions 124 contact the first metal layers 110 when the second metal layers 120 and the first metal layers 110 are bonded to each other. Therefore, the connection portions 122 and the power feed portions 124 stay behind as thickest portions of the second metal plate 120*a*.

Incidentally, the electrode pad portions 123 and the power feed portions 124 are coupled to the frame 120*b* by coupling portions 104, as shown in FIG. 8. Each of the coupling portions 104 is narrower in width than each of the electrode pad portions 123 and the power feed portions 124. The coupling portions 104 locally connect the electrode pad portions 123 and the power feed portions 124 to the frame 120*b*. Each of the coupling portions 104 is as thick as a sheet-like portion of each of the electrode pad portions 123 but thinner than each of the connection portions 122 and the power feed portions 124. Thus, the coupling portions 104 connect the electrode pad portions 123 and the power feed portions 124 to the frame 120*b*. Consequently, the electrode pad portions 123 and the power feed portions 124 which are separated from each other can be manufactured from one piece of second metal plate 120*a*.

Figure 9:
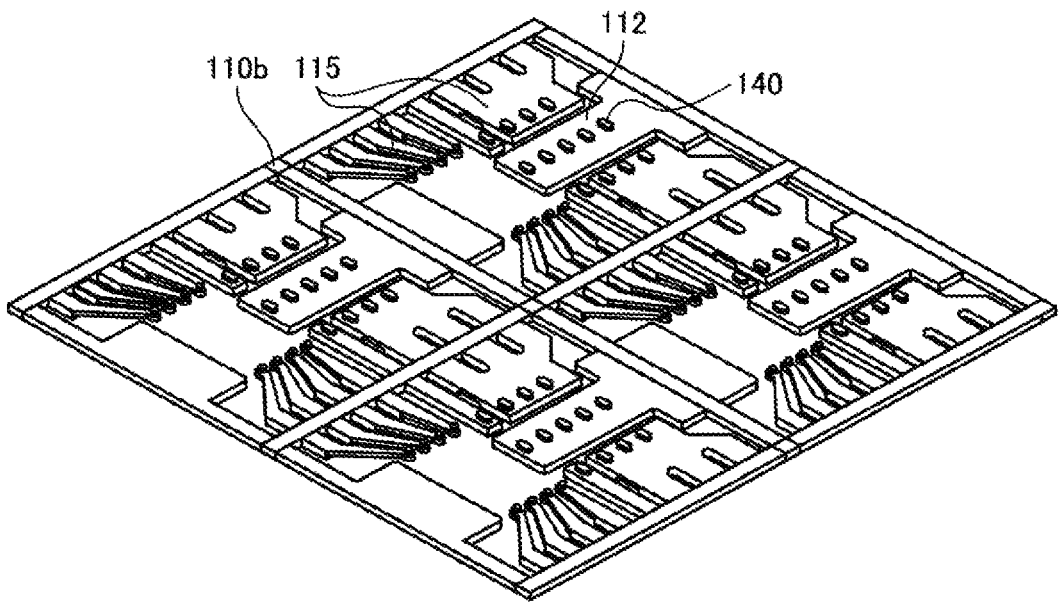
FIG. 9 is a view illustrating an electrode forming step.

When the first metal layers 110 and the second metal layers 120 are formed by etching the metal plates respectively, electrodes for mounting IC chips 130 are formed on upper faces of the first metal layers 110 (step S103). Specifically, by plating, electrodes 140 are formed at positions of the component placement portions 112 and the terminal portions 115 corresponding to terminals of the IC chips 130, for example, as shown in FIG. 9. Accordingly, for example, the electrodes 140 are formed respectively on the centers of the component placement portions 112 and end portions of the terminal portions 115 near the component placement portions 112. For example, Ni (nickel)/Ag (silver), Ni/Pd (palladium)/Au (gold), Sn (tin), Ag, or the like, can be a metal or metals used for plating the electrodes 140. Here, the Ni/Ag is a plating layer in which an Ni layer and an Ag layer are deposited in the named order from a lower layer side, and the Ni/Pd/Au is a plating layer in which an Ni layer, a Pd layer and an Au layer are deposited in the named order from the lower layer side. Incidentally, illustration of the electrodes 140 is omitted from all the drawings except FIG. 9.

Figure 10:
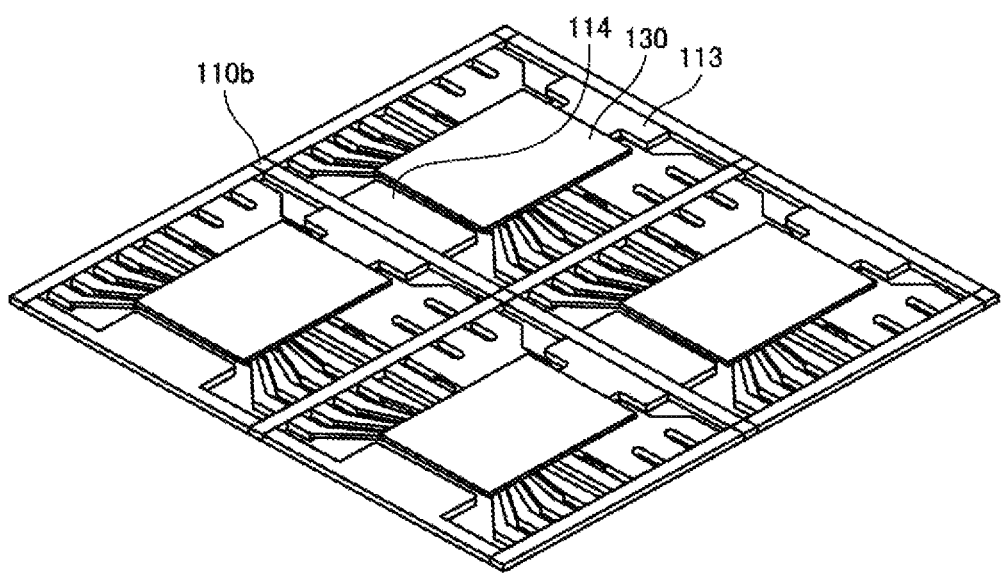
FIG. 10 is a view illustrating an IC chip mounting step.

The terminals 131 of the IC chips 130 are connected to the formed electrodes 140, and the IC chips 130 are flip-chip mounted on the first metal layers 110 (step S104). The flip-chip mounting of each of the IC chips 130 may be, for example, performed by reflow process. That is, solder bumps which are the terminals 131 of the IC chips 130 may be heated and melted to be connected to the electrodes 140. Thus, for example, as shown in FIG. 10, the IC chips 130 are respectively mounted on the first metal layers 110 of the first metal plate 110*a*. Even in the case where the IC chips 130 have been mounted, the other-layer support portions 113 and 114 are not covered with the IC chips 130.

Figure 11:
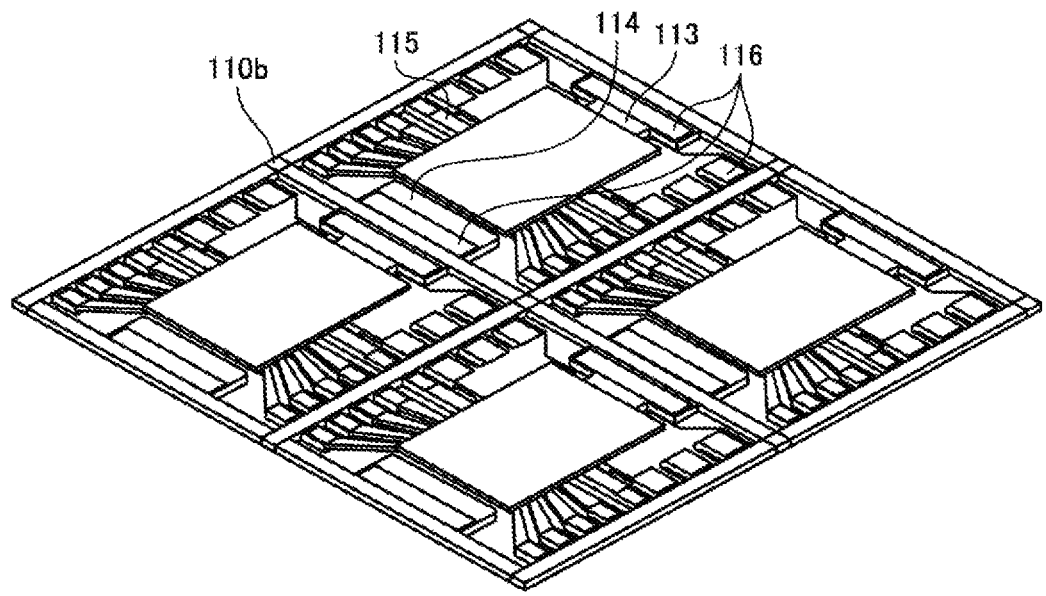
FIG. 11 is a view illustrating a solder applying step.

Solders for bonding the first metal layers 110 and the second metal layers 120 to each other are applied to the first metal layers 110 (step S105). Specifically, for example, as shown in FIG. 11, solders 116 are applied to the other-layer support portions 113 and 114 and the terminal portions 115. Places where the solders 116 are applied are positions of the other-layer support portions 113 and 114 corresponding to the connection portions 122 and positions of the terminal portions 115 corresponding to the power feed portions 124. The solders 116 are applied to the positions which will be connected to the second metal layer 120. The application of each of the solders 116 may be performed by printing a solder paste or by use of a dispenser. In addition, an electrically conductive paste may be used in place of the solder paste. Incidentally, illustration of the solders 116 is omitted from all the drawings except FIG. 11.

Figure 12:
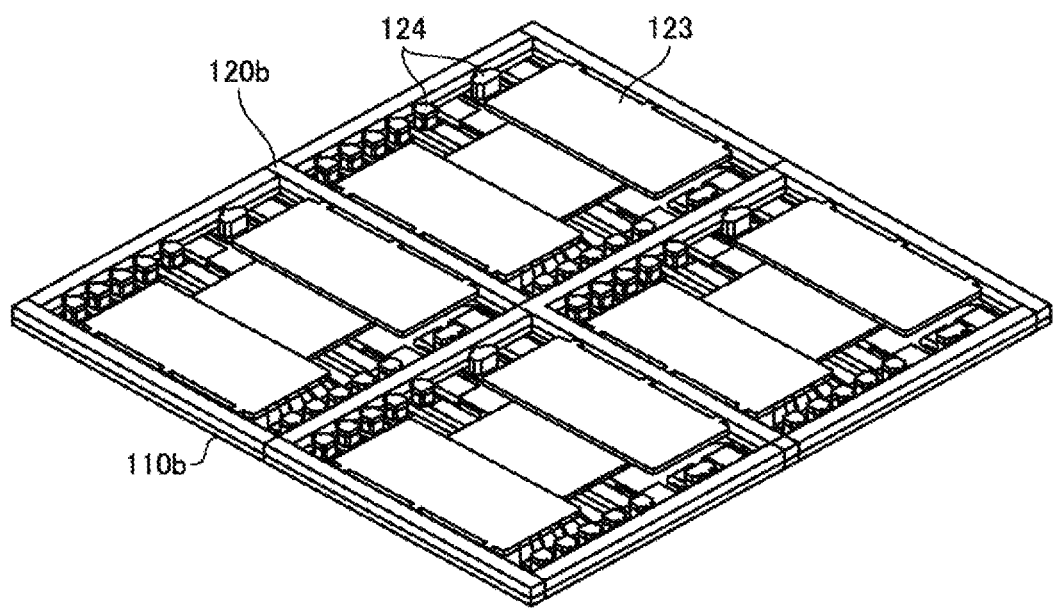
FIG. 12 is a view illustrating a metal layer bonding step.

When the solders 116 are applied to the first metal layers 110, the second metal layers 120 are then stacked thereon so that the first metal layers 110 and the second metal layers 120 are bonded to each other (step S106). That is, the solders 116 applied to the other-layer support portions 113 and 114 bond the connection portions 122, and the solders 116 applied to the terminal portions 115 bond the power feed portions 124, for example, by reflow process. Thus, an intermediate structure body in which the IC chips 130 are interposed between the first metal layers 110 and the second metal layers 120 is formed, for example, as shown in FIG. 12.

Figure 13:
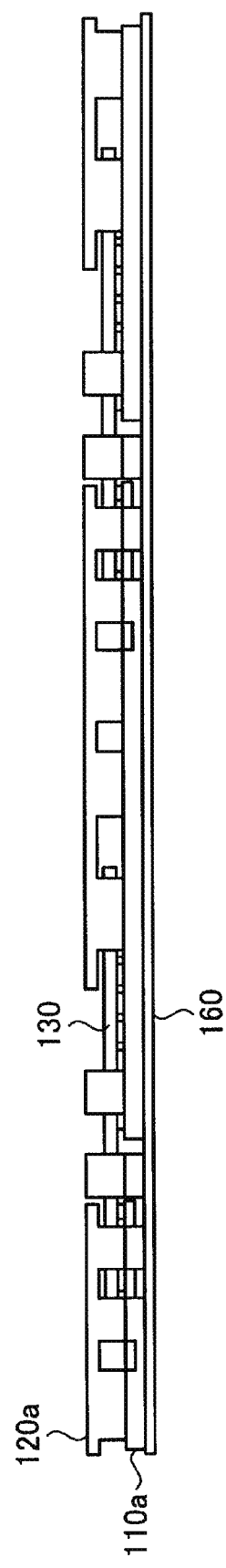
FIG. 13 is a side view showing the configuration of an intermediate structure body.
Figure 14:
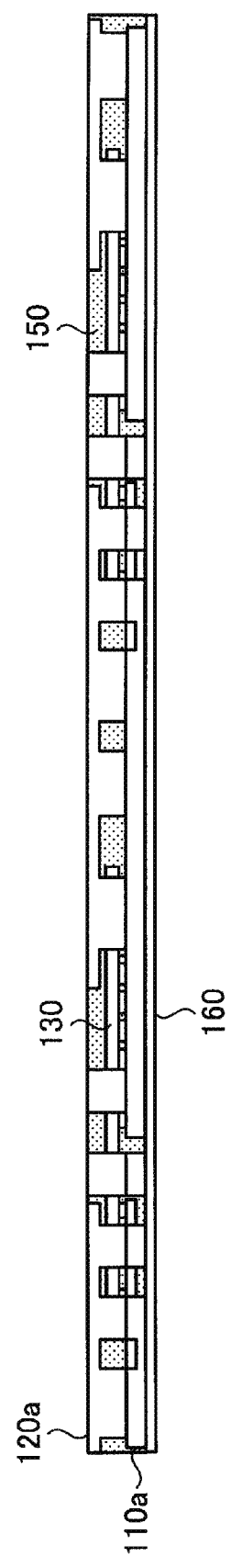
FIG. 14 is a view illustrating a resin encapsulating step.

The intermediate structure body is resin-encapsulated, for example, by transfer molding (step S107). That is, the intermediate structure body is set in a cavity of a mold, and uncured insulating resins 150 are injected into the cavity from a plunger, and the insulating resins 150 are then heated to be cured. On this occasion, for example, as shown in FIG. 13, a encapsulation molding tape 160 may be pasted to a lower face of the intermediate structure body (i.e. a lower face of the first metal plate 110*a*), and then, the intermediate structure body may be set in the cavity to be molded. Thus, burr of the insulating resins 150 is prevented. Incidentally, FIG. 13 is a side view showing the configuration of the intermediate structure body. Besides the transfer molding method, for example, a compression molding method, an injection molding method, or the like may be used as the resin encapsulating method. Since the intermediate structure body is resin-encapsulated, a space surrounding the first metal plate 110*a*, the second metal plate 120*a* and the IC chips 130 is filled with the insulating resins 150, for example, as shown in FIG. 14.

Figure 15:
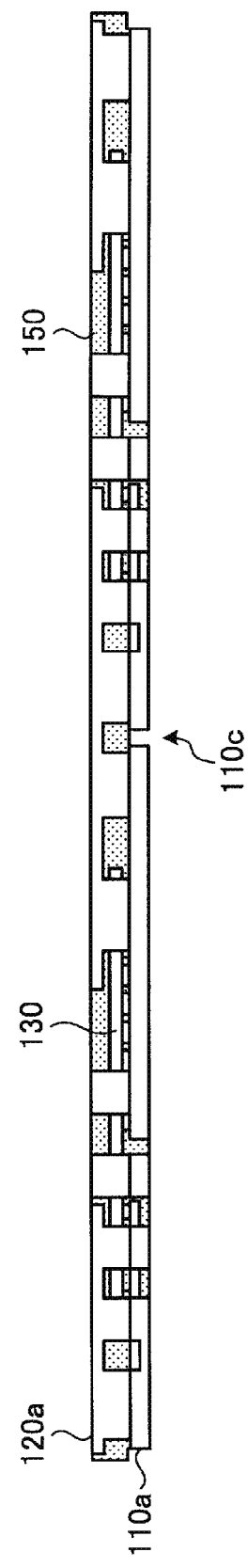
FIG. 15 is a view illustrating a groove forming step.

In the resin-encapsulated intermediate structure body, a plurality of electronic apparatuses 100 defined by the frame 110*b* and the frame 120*b* are arranged side by side into the latticed pattern. That is, here, the four first metal layers 110 are formed in the first metal plate 110*a*, and the four second metal layers 120 are formed in the second metal plate 120*a*. Accordingly, the four electronic apparatuses 100 are integrated in the intermediate structure body. Then, after the encapsulation molding tape 160 is removed from the resin-encapsulated intermediate structure body, the frame 110*b* of the first metal plate 110*a* defining the four electronic apparatuses 100 is cut so as to form grooves (step S108). Specifically, by half-cutting the intermediate structure body, the frame 10*b* of the first metal plate 110*a* is removed so that the grooves 10*c* are formed, for example, as shown in FIG. 15. In other words, the grooves 110*c* are formed in the frame 110*b* defining the four first metal layers 110, and the four first metal layers 110 are surrounded by the grooves 110*c* respectively. Incidentally, depth of each of the grooves 110*c* is substantially equal to thickness of the first metal plate 110*a*. Therefore, the grooves 110*c* do not reach the second metal plate 120*a*.

Since the grooves 110*c* are formed, end faces of outer peripheries of the other-layer support portions 113 and 114 and the terminal portions 115 in the first metal layers 110 are exposed in side walls of the grooves 110*c*. After the grooves 110*c* are formed, an upper face and the lower face of the intermediate structure body are polished to remove burr or residues of the insulating resins 150 from lower faces of the other-layer support portions 113 and 114 and the terminal portions 115 and upper faces of the electrode pad portions 123 and the power feed portions 124. The intermediate structure body may be polished, for example, by buff polishing and blast treatment.

Figure 16:
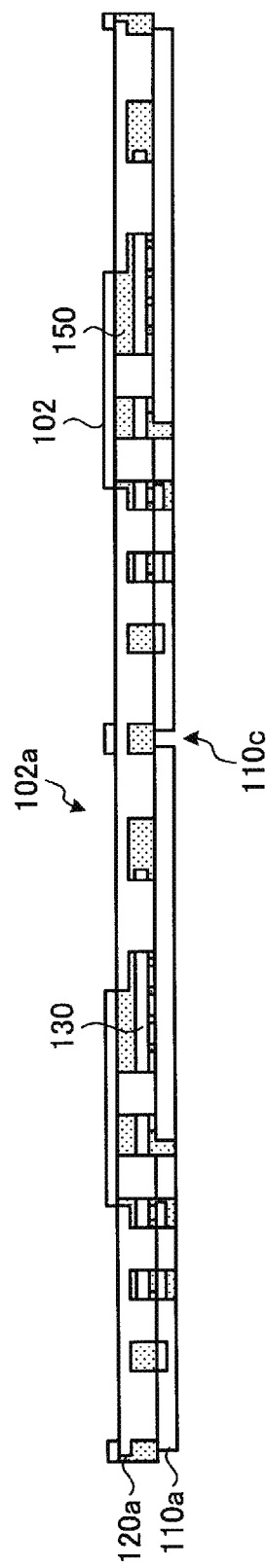
FIG. 16 is a view illustrating a solder resist layer forming step.

Solder resist layers 102 are formed on the upper face of the intermediate structure body where the upper faces of the electrode pad portions 123 and the power feed portions 124 are exposed (step S109). Specifically, the solder resist layers 102 covering the upper face of the intermediate structure body are formed, for example, as shown in FIG. 16. The solder resist layers 102 are formed, for example, by printing. On this occasion, opening portions 102*a* are formed in portions of the electrode pad portions 123 so as to expose the electrode pad portions 123. Accordingly, the solder resist layers 102 cover the power feed portions 124 and the insulating resins 150 forming the upper face of the intermediate structure body.

Metal portions exposed in the outside of the insulating resins 150 and the solder resist layers 102 are electrolytically plated (step S110). Specifically, electric power is fed from one end of the second metal plate 120*a* so as to electrolytically plate the surface of the entire intermediate structure body. On this occasion, the first metal plate 110*a* is separated into the four first metal layers 110 by the grooves 110*c*. However, the other-layer support portions 113 and 114 are connected to the second metal layers 120 through the connection portions 122, and the terminal portions 115 are connected to the second metal layers 120 through the power feed portions 124. Therefore, since the electric power is fed to the second metal plate 120*a*, the first metal layers 110 are also fed with the electric power so that electroplating layers are formed on the metal portions exposed from the insulating resins 150 of the first metal layers 110 and the second metal layers 120 and the solder resist layers 102.

Figure 17:
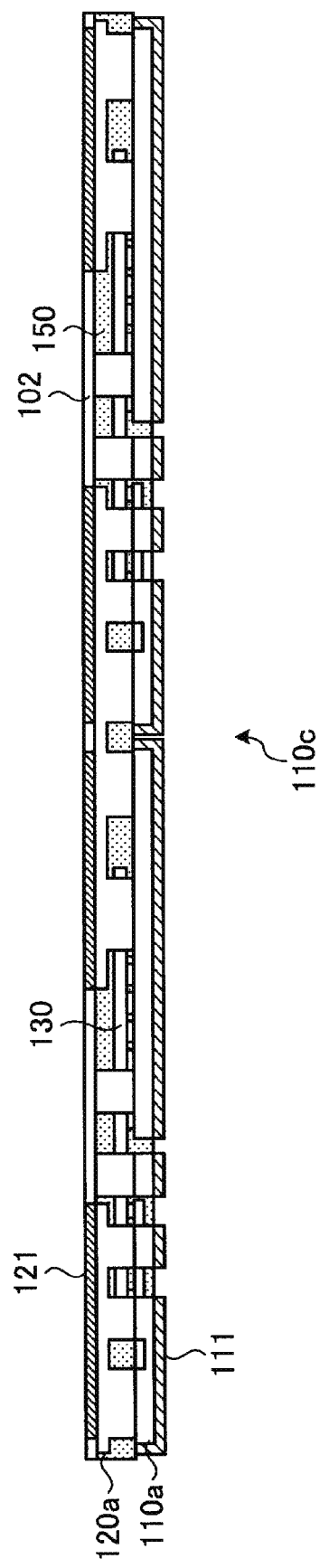
FIG. 17 is a view illustrating an electroplating step.

That is, for example, as shown in FIG. 17, electroplating layers 111 are formed on lower faces of the first metal layers 110 and side faces of outer peripheries of the first metal layers 110, and electroplating layers 121 are formed on the upper faces of the electrode pad portions 123 of the second metal layers 120. Thus, even when the four first metal layers 110 are separated by the grooves 110*c*, the respective portions of the first metal layers 110 are fed with electric power from the second metal layers 120. Therefore, the electroplating layers 111 can be simultaneously formed on the side faces of the outer peripheries of the first metal layers 110. A metal or metals similar to or the same as that or those of the aforementioned electrodes 140 can be the metal or metals used for the electroplating layers 111 and 121.

The intermediate structure body which has been electrolytically plated is divided into individual pieces, for example, by a dicer or a slicer (step S111). Thus, the plurality of electronic apparatuses 100 are obtained. That is, the frame 120*b* defining the second metal layers 120 of the second metal plate 120*a* and the insulating resin 150 between the respective electronic apparatuses 100 are cut so that the intermediate structure body is divided into, for example, the four electronic apparatuses 100. Side faces of an outer periphery of the second metal layer 120 protrude outward relatively to the side faces of the outer periphery of the first metal layer 110 in side faces of each of the electronic apparatuses 100. That is, side faces of external terminals 103 formed by the electroplating layer 111 are set back inward of the electronic apparatus 100 from the side faces of the outer periphery of the second metal layer 120. Faces of the coupling portions 104 cut from the frame 120*b* are exposed from the insulating resin 150 in the side faces of the outer periphery of the second metal layer 120. That is, side faces of the electrode pad portions 123 and the power feed portions 124 are covered with the insulating resin 150 and protected from an environment outside the electronic apparatus 100.

In the electronic apparatus 100 obtained by division into an individual piece, the IC chip 130 is mounted in the region interposed between the first metal layer 110 and the second metal layer 120, and the electrode pads 101 on which a passive component can be mounted are provided on the upper face of the second metal layer 120. Therefore, the IC chip 130 and the passive component are not arranged side by side planarly but can be disposed to be superimposed on each other in an up/down direction. Thus, a mounting area of the component can be reduced. As a result, the size of an apparatus provided with the electronic apparatus 100 and the passive component can be reduced.

Figure 18:
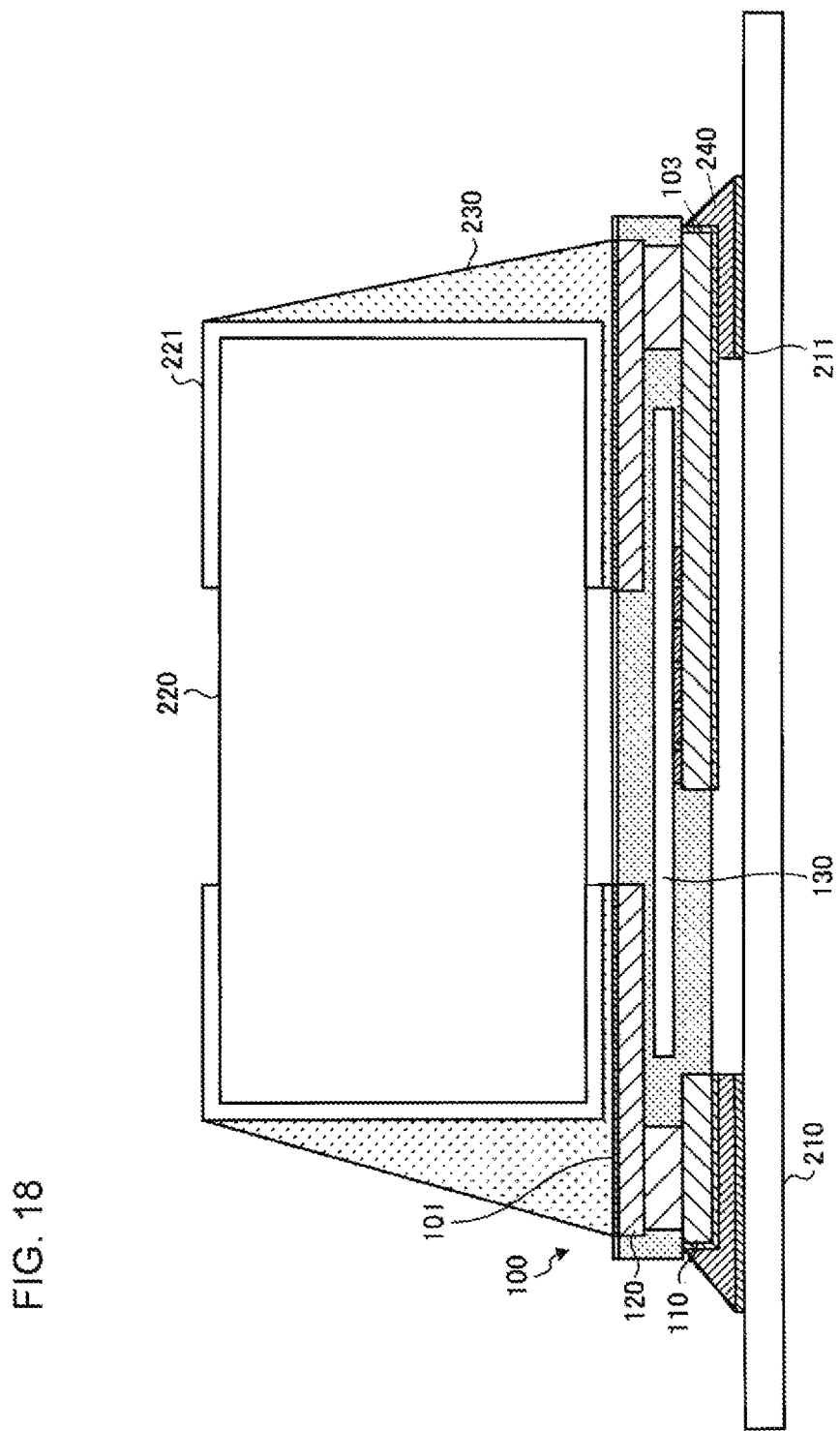
FIG. 18 is a view showing a mounting example on a circuit board.

For example, a passive component such as an inductor is mounted on each of the electronic apparatuses 100 (step S112). That is, by solders, electrodes of the passive component are connected to the electrode pads 101 which are obtained in such a manner that the electroplating layers 121 are formed on the upper faces of the electrode pad portions 123. Thus, the IC chip 130 and the passive component are disposed to be superimposed on each other in the up/down direction. The electronic apparatus 100 on which the passive component has been mounted may be, for example, placed on a circuit board. Specifically, for example, as shown in FIG. 18, a passive component 220 is mounted on the electronic apparatus 100, and the electronic apparatus 100 is placed on a circuit board 210. Electrodes 221 of the passive component 220 are connected to the electrode pads 101 by solders 230, and the external terminals 103 of the electronic apparatus 100 are connected to electrodes 211 of the circuit board 210 by solders 240. Incidentally, for example, an active component such as an IC component may be mounted on the electrode pads 101 in place of the passive component 220. Besides the inductor, for example, a capacitor, a resistor, or the like, can be used as the passive component 220.

Fillets formed by the solders 240 cover the side faces of the electronic apparatus 100. The electroplating layer 111 is also formed on the side faces of the outer periphery of the first metal layer 110 to serve as the external terminals 103. Accordingly, the lower face and the side faces of the electronic apparatus 100 are electrically connected to the electrodes 211. Therefore, mounting reliability of the electronic apparatus 100 on the circuit board 210 can be improved. In addition, the IC chip 130 is flip-chip mounted on the first metal layer 110. Accordingly, a conductor distance between the IC chip 130 and the circuit board 210 can be shortened so that parasitic inductance can be reduced to suppress generation of noise. Further, the connection portions 122 protrude from the lower faces of the electrode pad portions 123 to extend along the peripheral edges of the electrode pad portions 123 so that the second metal layer 120 and the first metal layer 110 are connected to each other in a relatively large area. Therefore, heat generated in the passive component 220 is efficiently transmitted to the first metal layer 110 and the circuit board 210 so that efficiency of heat radiation can be improved.

According to the present embodiment, as described above, the sheet-like electrode pad portions are provided in the second metal layer, the passive component is placed on the upper faces of the electrode pad portions, and the second metal layer and the first metal layer are connected to each other by the connection portions protruding from the lower faces of the electrode pad portions to extend along the peripheral edges of the electrode pad portions. The IC chip interposed between the second metal layer and the first metal layer is flip-chip mounted on the first metal layer. Therefore, the IC chip and the passive component can be disposed to be superimposed on each other three-dimensionally so that the area occupied by the IC chip and the passive component can be reduced. Consequently, the size of the apparatus can be reduced. In addition, the connection portions each having a relatively large area connect the second metal layer and the first metal layer to each other. Accordingly, a plurality of columnar connection portions disposed at intervals from one another can be dispensed with so that the size of the apparatus can be further reduced.

The IC chip 130 is mounted in the electronic apparatus 100 in the aforementioned embodiment. However, the electronic component mounted in the electronic apparatus 100 is not limited to the IC chip. For example, an active component such as a transistor or a diode or a passive component such as a chip capacitor, a chip inductor or a chip resistor can be used as the electronic component mounted on the electronic apparatus 100.

Figure 19:
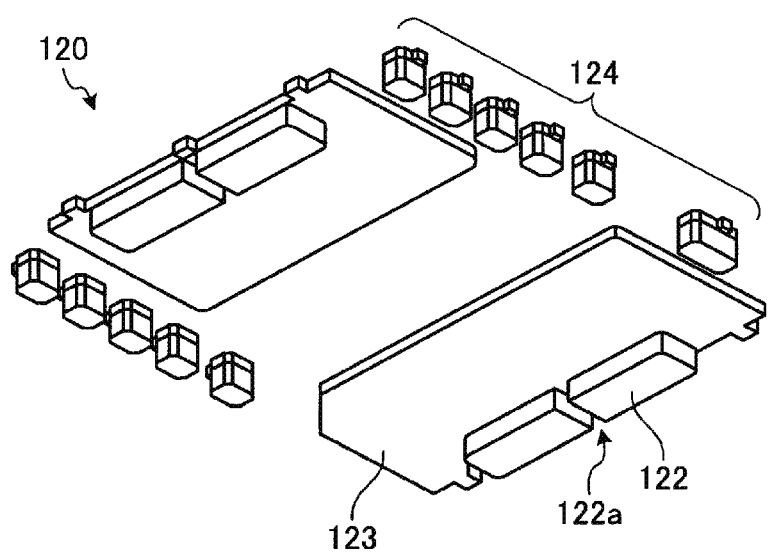
FIG. 19 is a perspective view showing a modification of the second metal layer.

In addition, the single connection portion 122 protrudes from each of the lower faces of the electrode pad portions 123 in the aforementioned embodiment. However, a slit may be provided in the vicinity of the center of the connection portion 122. Specifically, for example, as shown in FIG. 19, a slit 122a crossing a widthwise direction of the connection portion 122 may be provided in the vicinity of the center of the connection portion 122. Since the slit 122a connecting the inside and the outside of the second metal layer 120 is provided thus, flowability of the insulating resin 150 can be improved in the resin encapsulating step so that the insulating resin 150 can be easily filled into the space between the first metal layer 110 and the second metal layer 120.

Although the preferred embodiments etc. have been described in detail, the concept of the disclosure is not limited to the above-described embodiments etc. and various modifications and replacements can be made in the above-described embodiments etc. without departing from the scope of the claims.

Various aspects of the subject matter described herein are set out non-exhaustively in the following numbered clauses:

1) An electronic apparatus manufacturing method comprising:
forming a first metal layer;
forming a second metal layer that comprises a sheet-like electrode pad portion and a connection portion, wherein the connection portion is disposed along a peripheral edge of the electrode pad portion and protrudes from the electrode pad portion;
placing the electronic component on the first metal layer;
disposing the second metal layer on the electronic component and the first metal layer such that the connection portion is bonded to the first metal layer; and
filling an insulating resin into a space between the first metal layer and the second metal layer so as to cover the electronic component.

What is claimed is:
1. An electronic apparatus comprising:
a first metal layer;
an electronic component that is provided on the first metal layer;
a second metal layer that is provided on the first metal layer and on the electronic component; and
an insulating resin that fills a space between the first metal layer and the second metal layer so as to cover the electronic component,
wherein the second metal layer comprises:
a first electrode pad portion that is rectangular shaped;
a second electrode pad portion that is rectangular shaped and that faces the first electrode pad portion and is disposed to be separated from the first electrode pad portion;
a single first connection portion that is disposed to extend along one side of the first electrode pad portion, and that protrudes from the first electrode pad portion toward the first metal layer so as to electrically connect the first electrode pad portion to the first metal layer; and
a single second connection portion that is disposed to extend along one side of the second electrode pad portion, and that protrudes from the second electrode pad portion toward the first metal layer so as to electrically connect the second electrode pad portion to the first metal layer.

2. The electronic apparatus according to claim 1, wherein the first and second connection portions are higher in height than the electronic component.

3. The electronic apparatus according to claim 1, wherein each of the first and second electrode pad portions overlaps with the electronic component in plan view, and has a face exposed from the insulating resin.

4. The electronic apparatus according to claim 1, wherein the first metal layer comprises:
a placement portion on which the electronic component is placed,
a first support portion that contacts the first connection portion to support the second metal layer,
a second support portion that contacts the second connection portion to support the second metal layer, and
a terminal portion that extends from a terminal of the electronic component placed on the placement portion to an outer periphery of the electronic apparatus.

5. The electronic apparatus according to claim 4, wherein an end face of the terminal portion is exposed from the insulating resin.

6. The electronic apparatus according to claim 5, further comprising:
a plating layer that covers the end face of the terminal portion.

7. The electronic apparatus according to claim 4, wherein each of the first and second support portions comprises:
a surface that contacts the connection portion, and
a side face that is adjacent to the surface and that is exposed from the insulating resin.

8. The electronic apparatus according to claim 7, wherein a plating layer covers the side faces of the first and second support portions.

9. The electronic apparatus according to claim 4, wherein the terminal portion comprises a plurality of metal plates separated from one another, and
the second metal layer further comprises a plurality of terminal connection portions each of which is connected to a corresponding one of the metal plates.

10. The electronic apparatus according to claim 1, wherein
a slit is provided in each of the first and second connection portions.

* * * * *